(12) United States Patent
Kushta et al.

(10) Patent No.: US 8,536,464 B2
(45) Date of Patent: Sep. 17, 2013

(54) MULTILAYER SUBSTRATE

(75) Inventors: Taras Kushta, Tokyo (JP); Jun Sakai, Tokyo (JP); Hikaru Kouta, Tokyo (JP)

(73) Assignee: NEC Corporation, Tokyo (JP)

( * ) Notice: Subject to any disclaimer, the term of this patent is extended or adjusted under 35 U.S.C. 154(b) by 184 days.

(21) Appl. No.: 12/994,774

(22) PCT Filed: May 26, 2008

(86) PCT No.: PCT/JP2008/060090
§ 371 (c)(1),
(2), (4) Date: Nov. 26, 2010

(87) PCT Pub. No.: WO2009/144829
PCT Pub. Date: Dec. 3, 2009

(65) Prior Publication Data
US 2011/0079422 A1    Apr. 7, 2011

(51) Int. Cl.
*H05K 1/11*    (2006.01)
(52) U.S. Cl.
USPC .................... 174/266; 174/261; 174/262
(58) Field of Classification Search
None
See application file for complete search history.

(56) References Cited

U.S. PATENT DOCUMENTS

| | | | | |
|---|---|---|---|---|
| 6,787,710 | B2 * | 9/2004 | Uematsu et al. | 174/261 |
| 7,030,712 | B2 * | 4/2006 | Brunette et al. | 333/33 |
| 7,897,880 | B1 * | 3/2011 | Goergen et al. | 174/262 |
| 2002/0179332 | A1 | 12/2002 | Uematsu et al. | |
| 2004/0212971 | A1 | 10/2004 | Iguchi | |
| 2005/0247482 | A1 | 11/2005 | Nakamura | |
| 2006/0185890 | A1 * | 8/2006 | Robinson | 174/255 |

FOREIGN PATENT DOCUMENTS

| | | |
|---|---|---|
| JP | 6-85099 | 3/1994 |
| JP | 2003-031945 | 1/2003 |
| JP | 2005-277028 | 10/2005 |
| JP | 2007-234715 | 9/2007 |
| WO | WO 2007/046271 | 4/2007 |

OTHER PUBLICATIONS

International Search Report/PCT/JP2008/060090, Sep. 16, 2008.

* cited by examiner

*Primary Examiner* — Ishwarbhai Patel
(74) *Attorney, Agent, or Firm* — Young & Thompson

(57) ABSTRACT

A multilayer substrate is provided with a conductor plane region in which a plurality of conductor planes are disposed; a clearance region disposed adjacent to the conductor plane region so that the plurality of conductor planes are excluded from the clearance region. A plurality of signal vias are disposed through the clearance region so that the plurality of signal vias are isolated from the plurality of conductor planes. A conductor post is connected to one of the plurality of conductor planes and disposed between two of the signal vias in the clearance region.

23 Claims, 21 Drawing Sheets

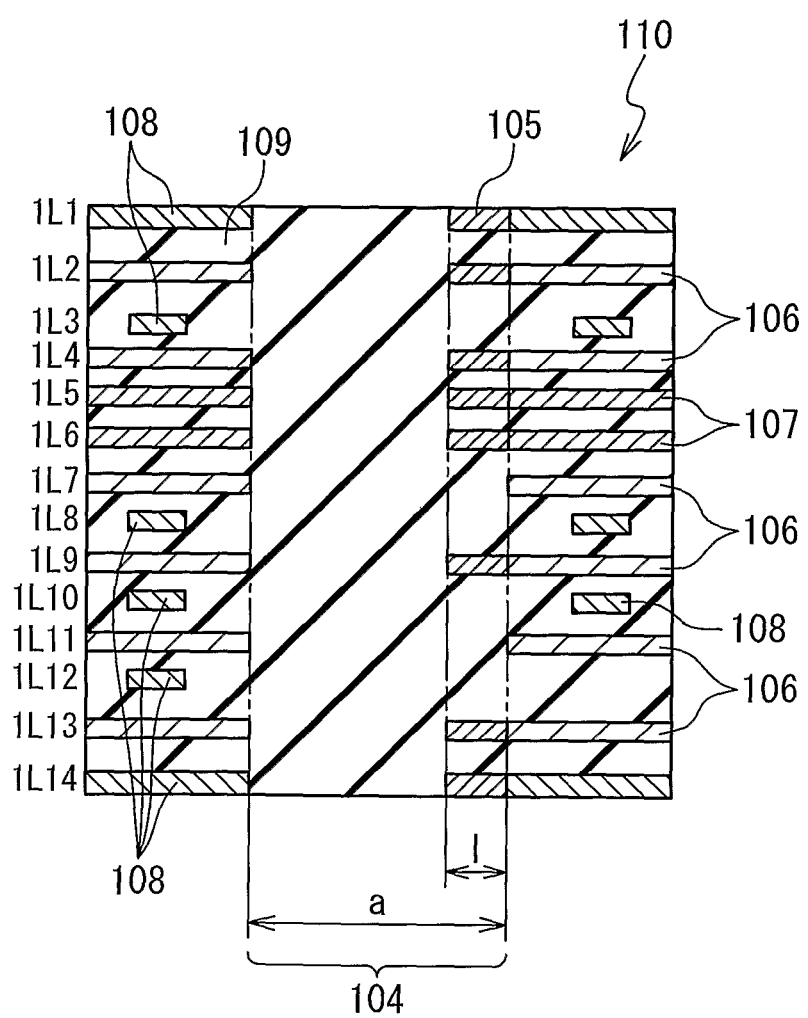

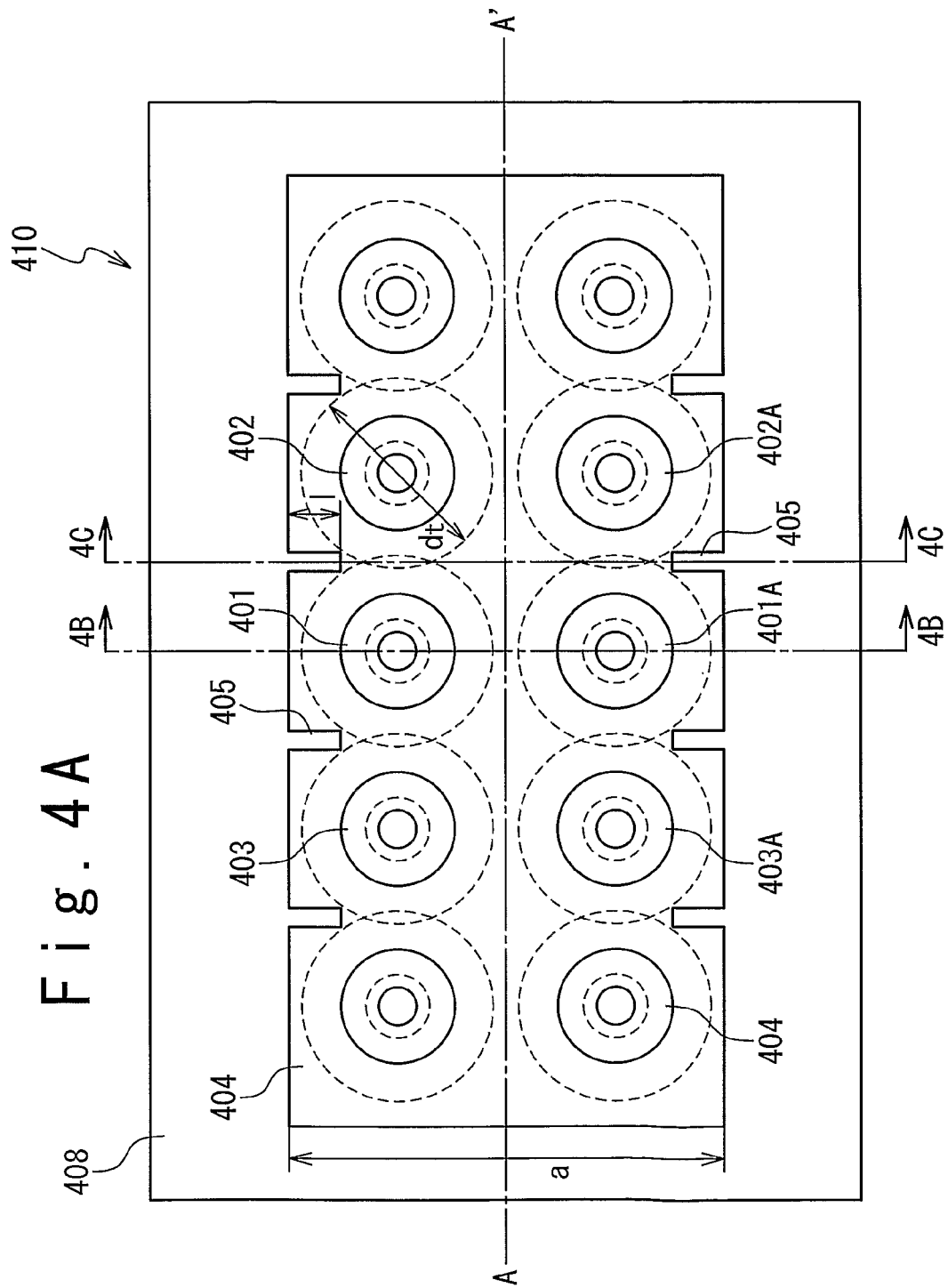

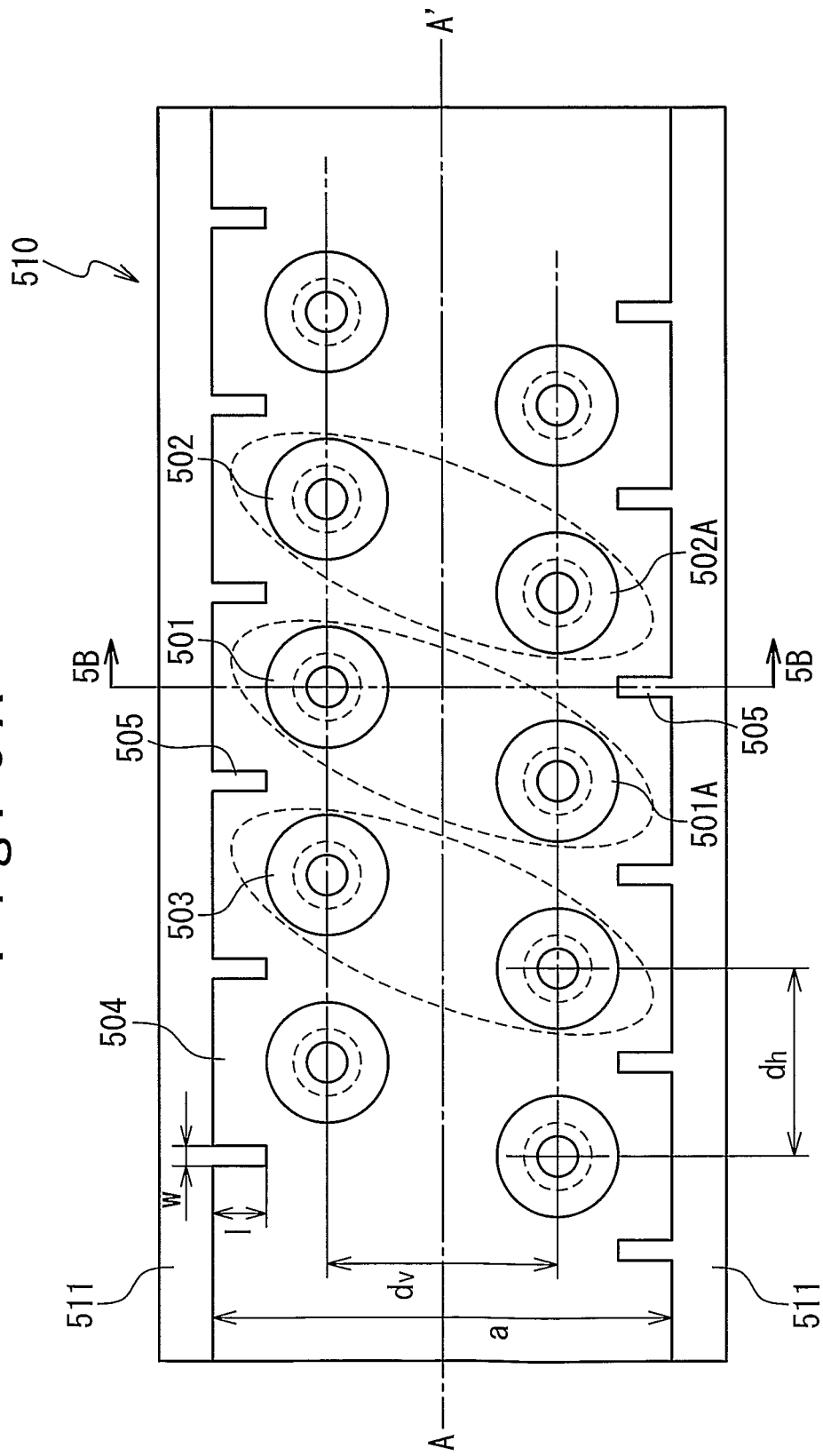

MULTILAYER SUBSTRATE

TECHNICAL FIELD

The present invention relates to a multilayer substrate, including a multilayer printed circuit board, with reduced crosstalk between vertical transitions disposed in the substrate.

BACKGROUND ART

Both high-speed and high-density data transmission channels are a request of modern and next-generation supercomputing and networking systems. Implementation of electrical wiring technologies for such channels requires overcoming a number of difficulties such as impedance matching problems, crosstalk effects, unwanted resonances, and so on.

Vertical interconnections connecting planar transmission lines disposed at different conductor layers are important elements to develop multilayer substrate technologies which are a cost-effective approach to dispose electrical wiring of high-speed systems. Therefore, improvement of impedance control and increase of density in the vertical interconnections satisfying simultaneously crosstalk requirements are complicated issues on a way in promotion higher speed in the systems.

There is a need for providing a multilayer substrate providing high-density vertical interconnections with improved impedance matching and reduced crosstalk effects between vertical interconnections.

Japanese Laid Open Patent Application No. JP-P2003-31945A discloses a multilayer substrate in which a number of vias are disposed within a clearance region. In such via configurations, however, a large crosstalk effect can be excited.

Japanese Laid Open Patent Application No. JP-A-Heisei, 06-85099 discloses that a via structure is shielded by ground vias connected with a ground strip at conductor layers. However, in high-density configurations, such shielding structure can not be applied between signal vias due to dimensional tolerances of a via fabrications process. Also, a real multilayer substrate consists of a number of different planar conductor layers such as analog and digital ground planes and power supply planes. At these layers, the strip cannot be connected to the ground vias due to the difference in the potential.

Japanese Laid Open Patent Application No. JP-P2005-277028A discloses that a ground strip is used to reduce crosstalk between signal via structures. In this case, however, it is also difficult to use such approach in high-density configurations.

DISCLOSURE OF INVENTION

It is an objective of the present invention to provide a multilayer substrate providing high-density vertical interconnections with improved impedance matching and reduced crosstalk effects between vertical interconnections.

In an aspect of the present invention, a multilayer substrate is provided with a conductor plane region in which a plurality of conductor planes are disposed; and a clearance region disposed adjacent to the conductor plane region so that the plurality of conductor planes are excluded from the clearance region. A plurality of signal vias are disposed through the clearance region so that the plurality of signal vias are isolated from the conductor planes. A conductor post is connected to one of the plurality of conductor planes and disposed between two of the signal vias in the clearance region.

BRIEF DESCRIPTION OF DRAWINGS

FIG. 1C is a vertical cross-sectional view illustrating the structure of the multilayer substrate shown in FIG. 1A on the 1C-1C section;

FIG. 4A is a top view of a multilayer substrate in still another exemplary embodiment of the present invention;

FIG. 5A is a top view of a multilayer substrate in still another exemplary embodiment of the present invention;

BEST MODE FOR CARRYING OUT THE INVENTION

Figure 1A:
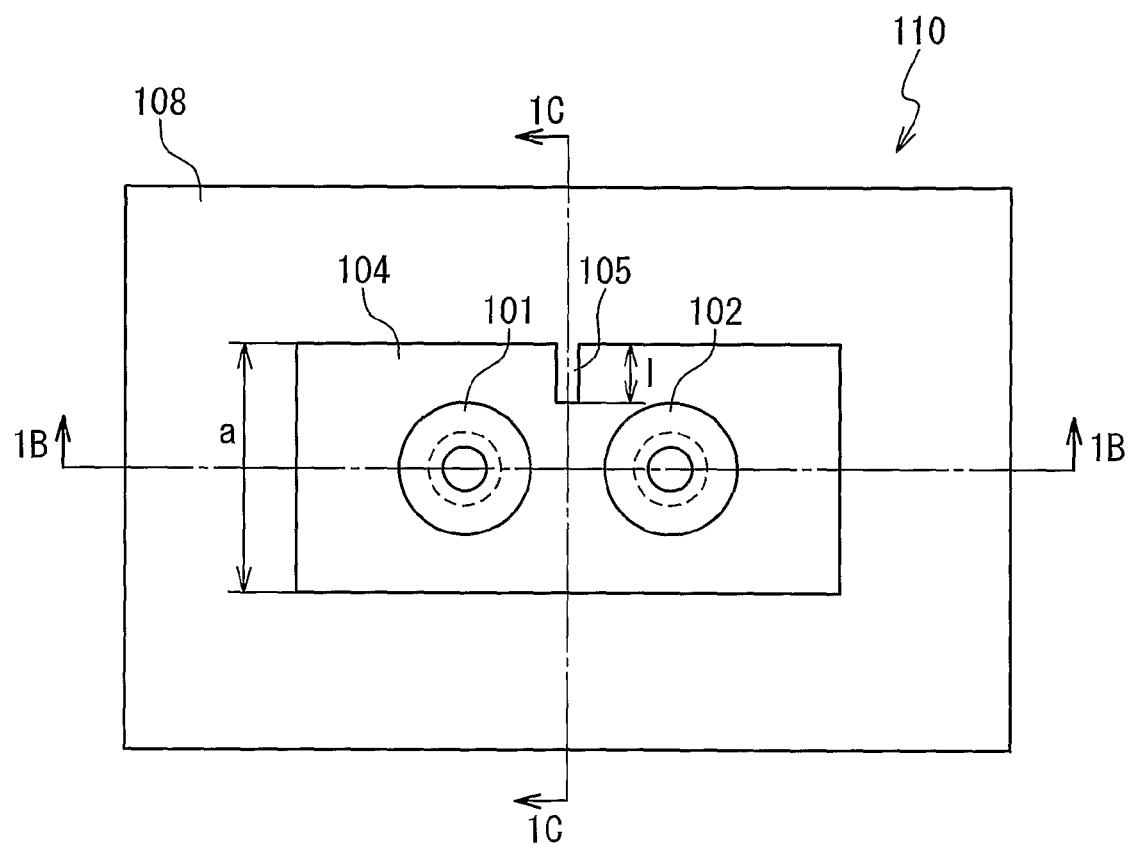
FIG. 1A is a top view of a multilayer substrate in an exemplary embodiment of the present invention.
Figure 1B:
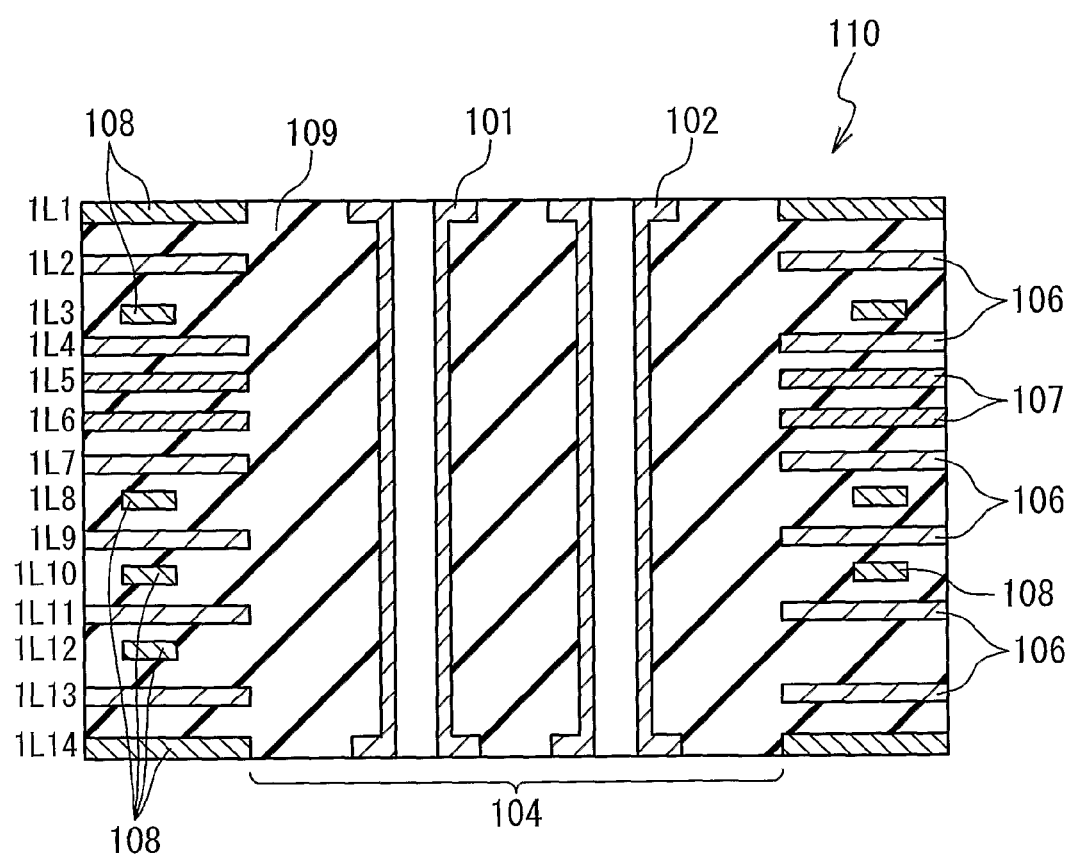
FIG. 1B is a vertical cross-sectional view illustrating the structure of the multilayer substrate shown in FIG. 1A on the 1B-1B section.

Hereinafter, several types of multilayer substrates comprising via structures in which conductive posts are used between signal vias to reduce coupling and finally crosstalk effects in whole high-speed interconnected structures formed in the multilayer substrates.

In an exemplary embodiment, as shown in FIGS. 1A to 1D, a multilayer substrate 110 is provided with a plurality of conductor layers, denoted by the numerals 1L1 to 1L14. Provided at the respective conductor layers 1L1 to 1L14 are conductor planes isolated by dielectric material 109. These conductor planes include ground planes 106, power supply planes 107, and signal layers 108.

The multilayer substrate 110 is composed of a conductor plane region and a clearance region. The conductor planes are provided only in the conductor plane region; the conductor planes are excluded from the clearance region 104. In FIGS. 1A-1D, the clearance region is denoted by the numeral 104.

Signal vias 101 and 102 are disposed through the clearance region 104 of the multilayer substrate 110. The clearance region 104 provides isolation of the signal vias 101 and 102 from the conductor planes.

Figure 1D:
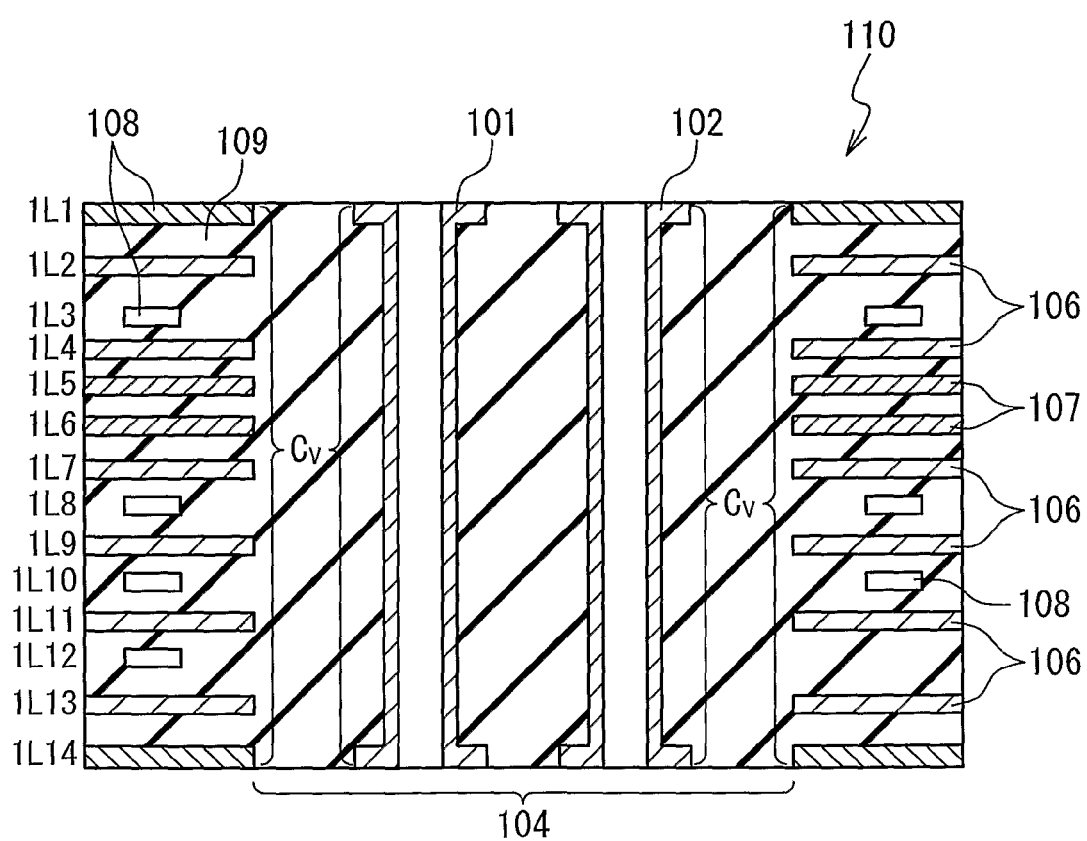
FIG. 1D is a vertical cross-sectional view illustrating the structure of the multilayer substrate shown in FIG. 1A.

The dimensions of the clearance region 104 are an effective tool to control the characteristic impedance of the via structure by means of capacitive coupling, $C_v$, of the signal vias and the conductive planes as shown in FIG. 1D.

Conductive posts 105 are used to reduce crosstalk between the signal vias 101 and 102 in this exemplary embodiment. In this exemplary embodiment, the conductive posts 105 are connected with the conductor planes of the conductor layers 1L1, 1L2, 1L4, 1L5, 1L6, 1L9, 1L13 and 1L14. The conductive posts 105 are disposed to extend from the conductive planes toward the area between the signal vias 101 and 102.

To explain the effect of the conductive posts 105 and a way to define optimal dimensions of the clearance region 104, the following procedure may be used. First of all, it is preferable that the in-plane shape of the clearance region 104 is rectangular if it compared with usually-used circular one, since the clearance region 104 of rectangular shape leads to more compact dimensions of the via structure. It can be traced from explanations given in the following.

Figure 2A:
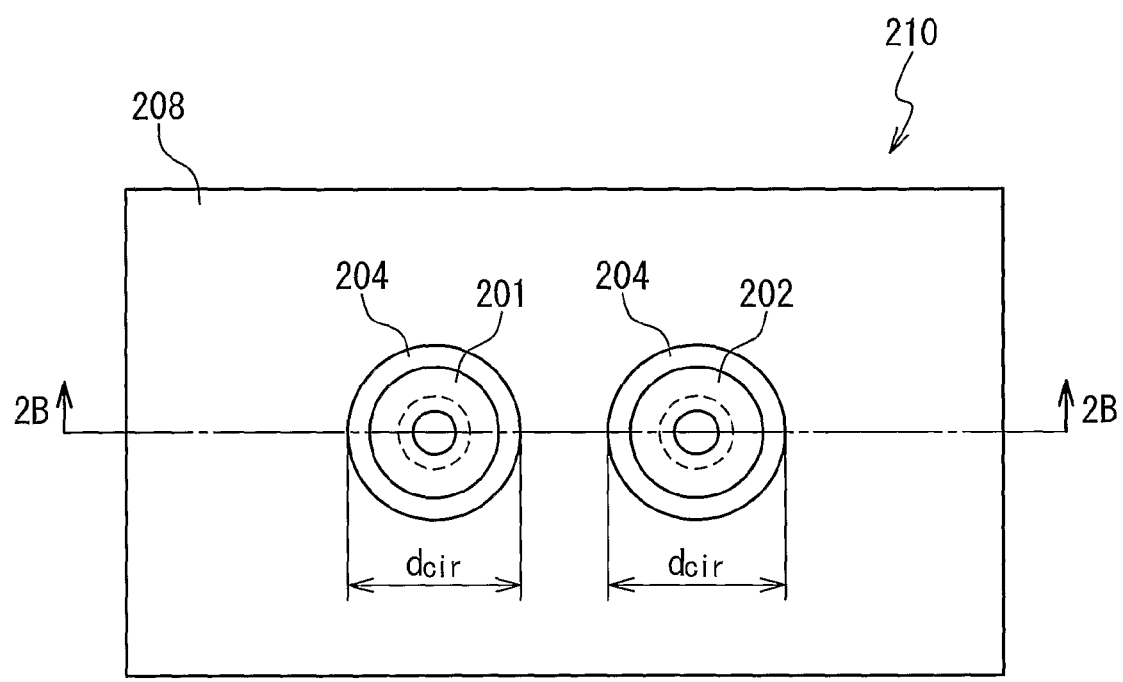
FIG. 2A is a top view of a 14-conductor-layer multilayer substrate with a circular clearance region.
Figure 2B:
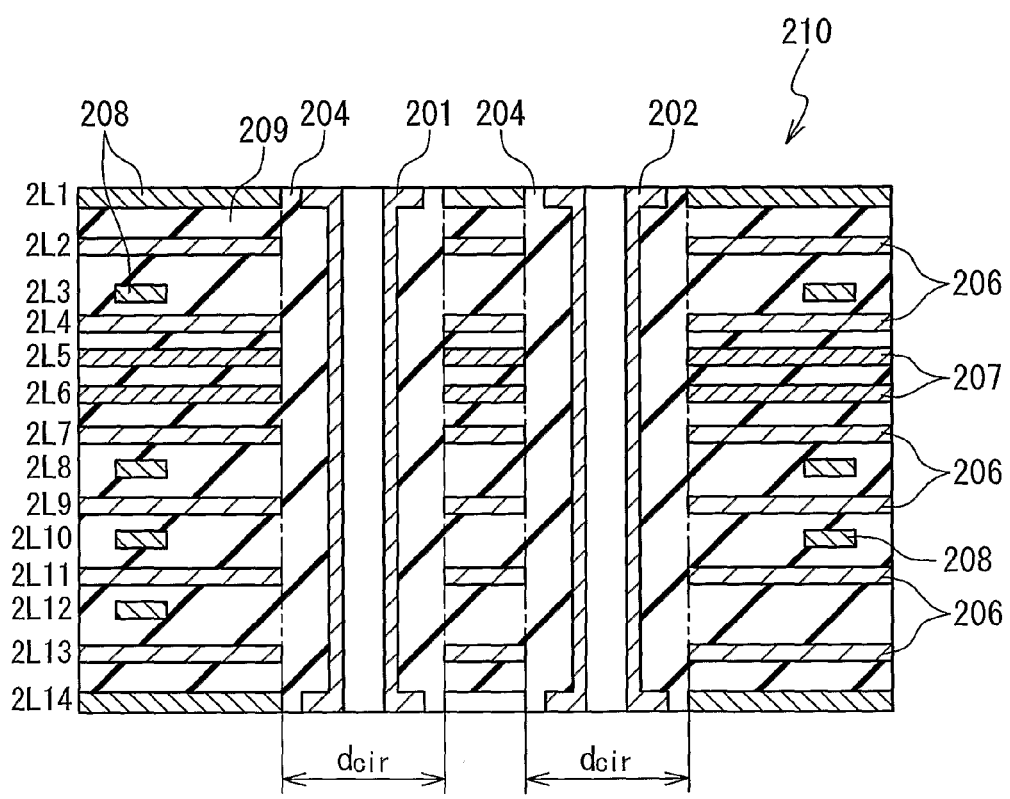
FIG. 2B is a vertical cross-section showing the structure of the multilayer substrate of FIG. 2A on the 2B-2B section.

In FIGS. 2A and 2B, a via structure comprising two signal vias 201 and 202 with circular clearance regions 204 is shown. The diameter of the clearance regions 204 is $d_{cir}$. In FIGS. 2A and 2B, the signal vias 201, 202 and the clearance region 204 form a coaxial transmission line with the circular outer conductive boundary.

Figure 2C:
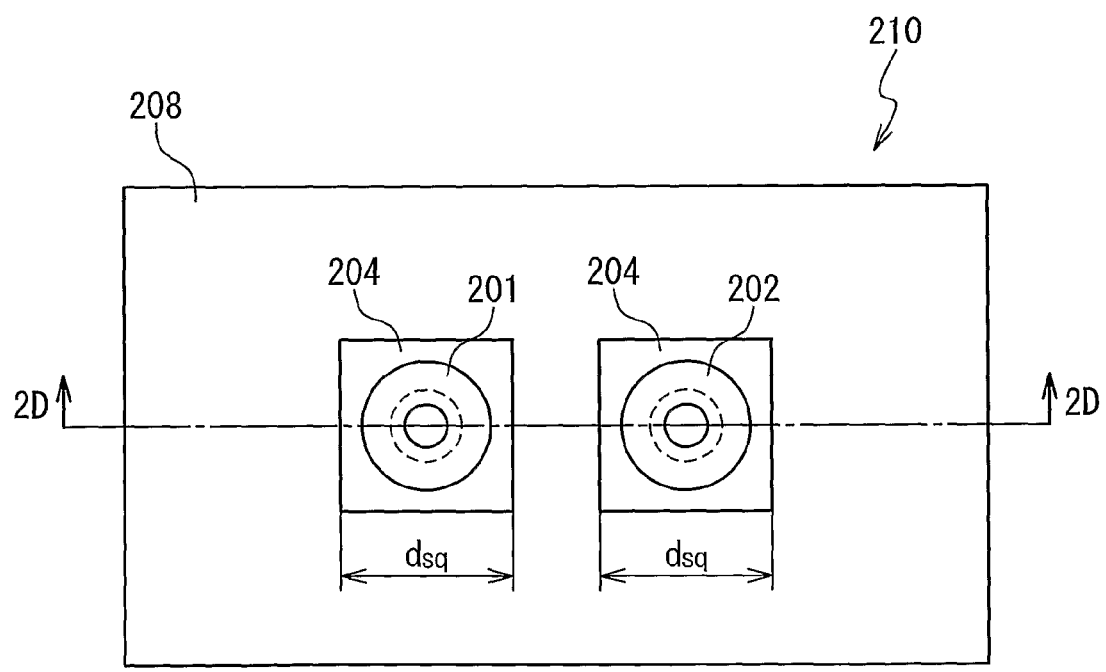
FIG. 2C is a top view of a 14-conductor-layer multilayer substrate with squire clearance regions.
Figure 2D:
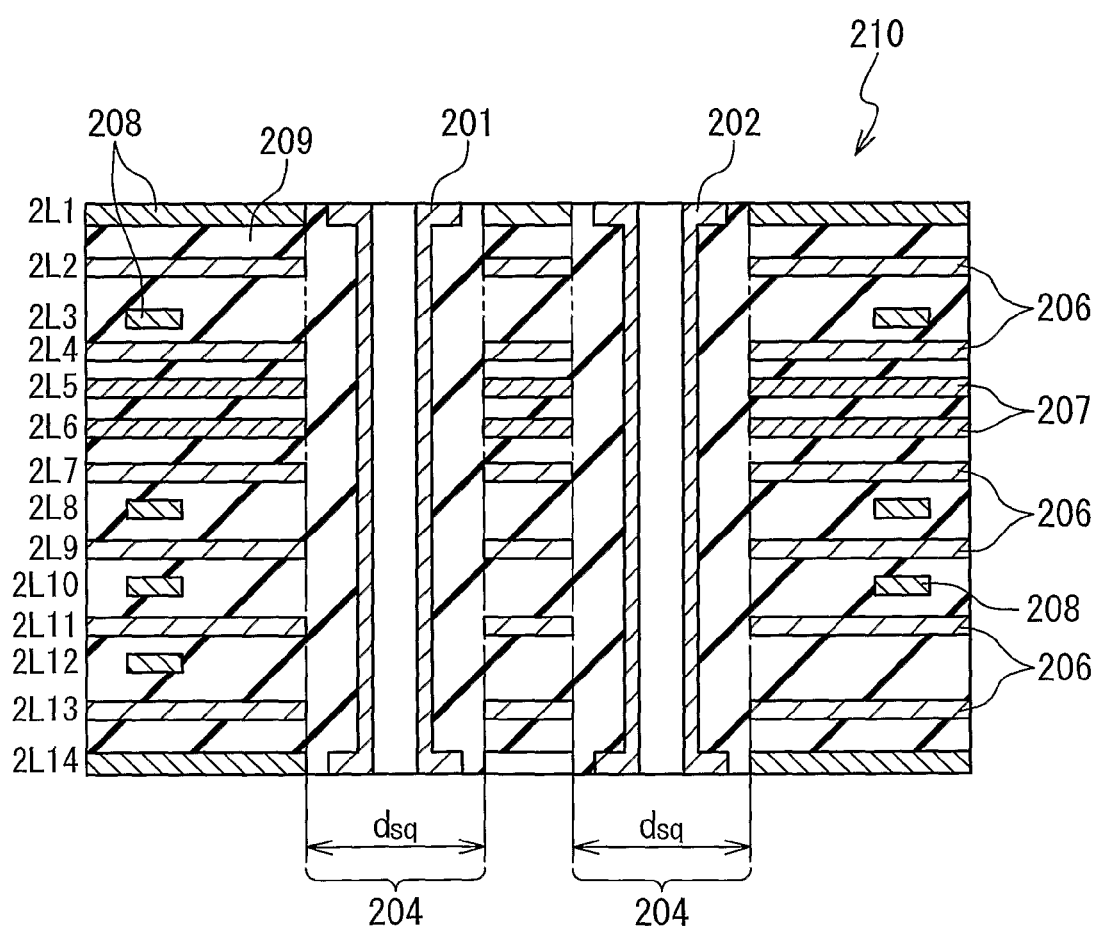
FIG. 2D is a vertical cross-sectional view showing the multilayer structure of FIG. 2C on the 2D-2D section.

In FIGS. 2C and 2D, another via structure including two signal vias 201 and 202 with square clearance regions 204 is presented. The signal vias 201, 202 and the clearance region 204 in FIGS. 2C and 2D give a coaxial transmission line with the square outer conductive boundary.

It is well-known that the characteristic impedance will have the same magnitude for circular and square coaxial transmission lines when the outer diameter $d_{cir}$ of the circular coaxial transmission line and the side $d_{sq}$ of the square coaxial transmission line will satisfied the following identity:

$$d_{cir} = 1.0787\, d_{sq}. \quad (1)$$

It should be noted that Eq. (1) is valid if other parameters of circular and square coaxial transmission lines such as dimensions of the signal vias and constitutive parameters (relative permittivity, $\epsilon$, and relative permeability, $\mu$) of the dielectric material 209 filling in the multilayer substrate 210 will be the same.

As follows from Eq. (1), the transverse dimensions of the via structure with the square clearance region will be smaller than in the via structure with the circular clearance region to provide the same characteristic impedance.

Figure 2E:
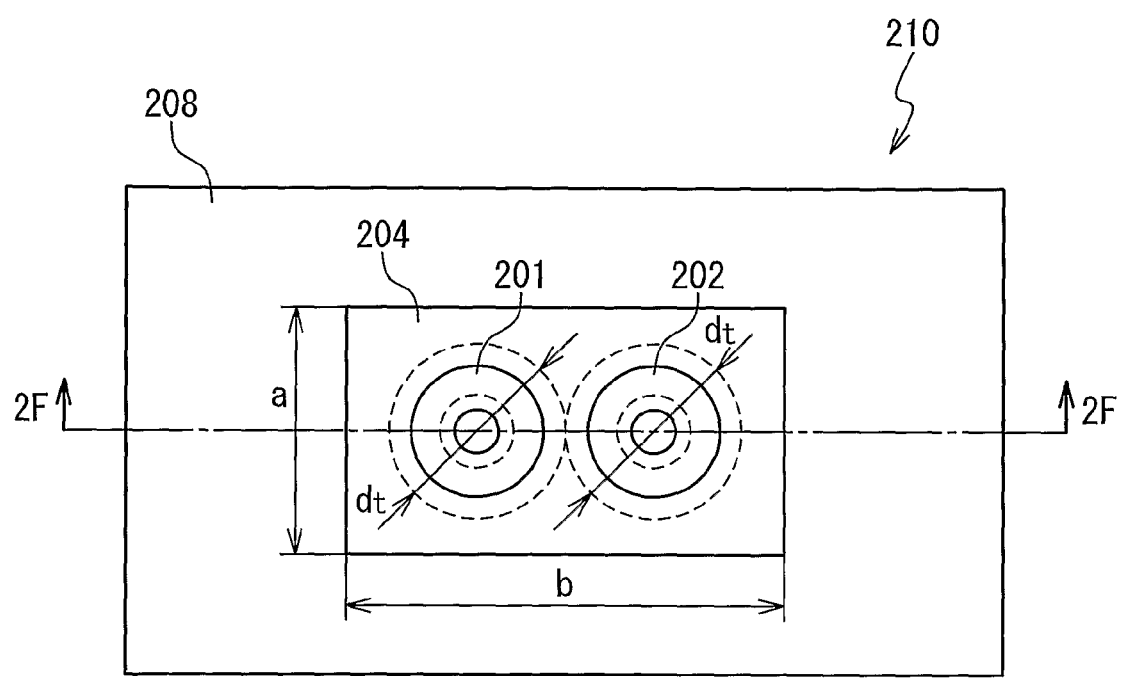
FIG. 2E is a top view showing the 14-conductor-layer multilayer substrate with an optimized rectangular clearance region.
Figure 2F:
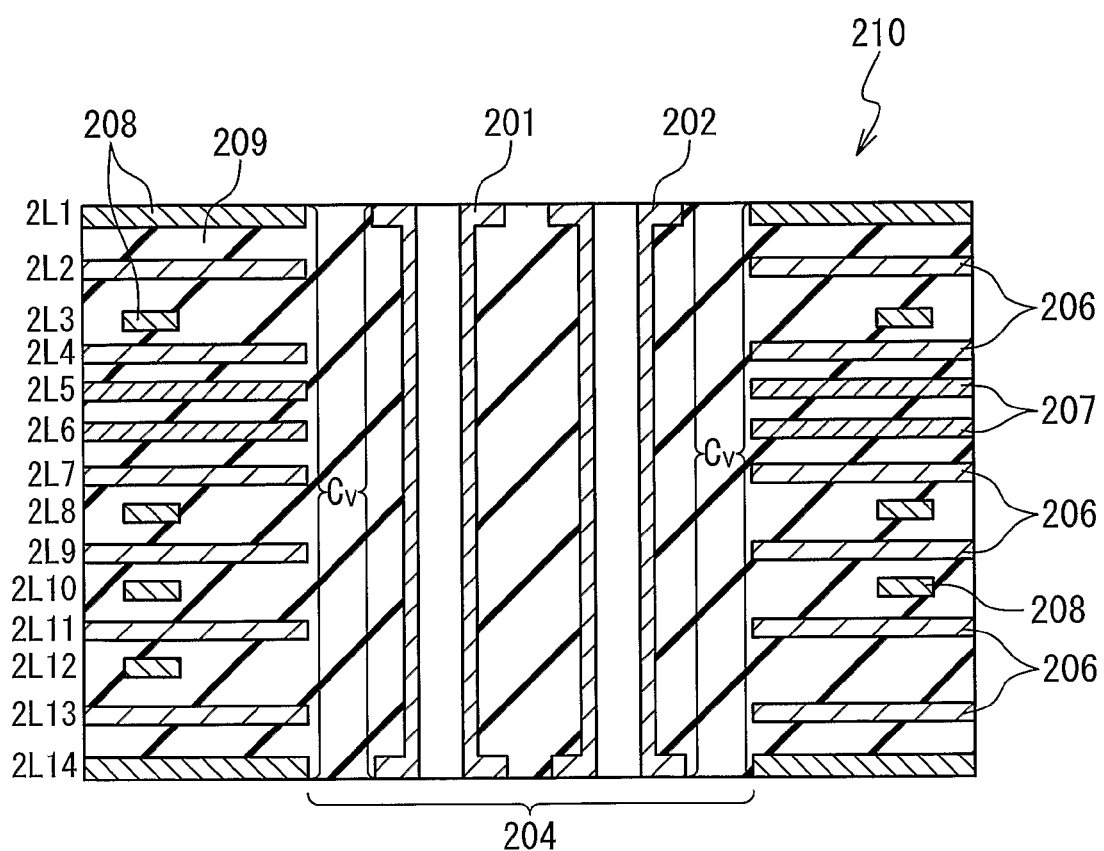
FIG. 2F is a vertical cross-sectional view showing the multilayer structure of FIG. 2E on the 2F section.

Application of the square clearance region in high-density via configurations may lead to a structure of the clearance region 204 as shown in FIGS. 2E and 2F which has a rectangular shape. This via structure comprising two signal vias 201 and 202 is isolated from conductive layers of the multilayer substrate by the rectangular clearance region 204. The optimal dimensions of this clearance region 204 can be defined by simulations, for example, in which sides of the clearance region 204, marked as a and b in FIG. 2E, will be changed step-by-step.

In the via structure shown in FIGS. 2E and 2F, however, crosstalk (coupling effects) may considerably increase and, as a result, the electrical performance of the interconnections based on the multilayer substrate may degrade.

One approach to reduce such problem may be providing conductive strips at different conductor layers between signal via structures. In high-density via configurations, however, it is difficult to apply such strips due to dimensional tolerances of via fabrication processes. In FIG. 2E, the diameter $d_t$ defines tolerance of the fabrication process. As one can see from this figure, it is impossible to dispose a strip between signal vias, because isolation of the signal via and the strip cannot be provided in this case.

As a solution, conductive posts 105 are disposed as shown in FIGS. 1A-1D in this exemplary embodiment. The use of such posts leads to concentration of the electromagnetic field in the area between the signal vias and the conductive posts, reducing coupling between the signal vias.

Figure 3A:
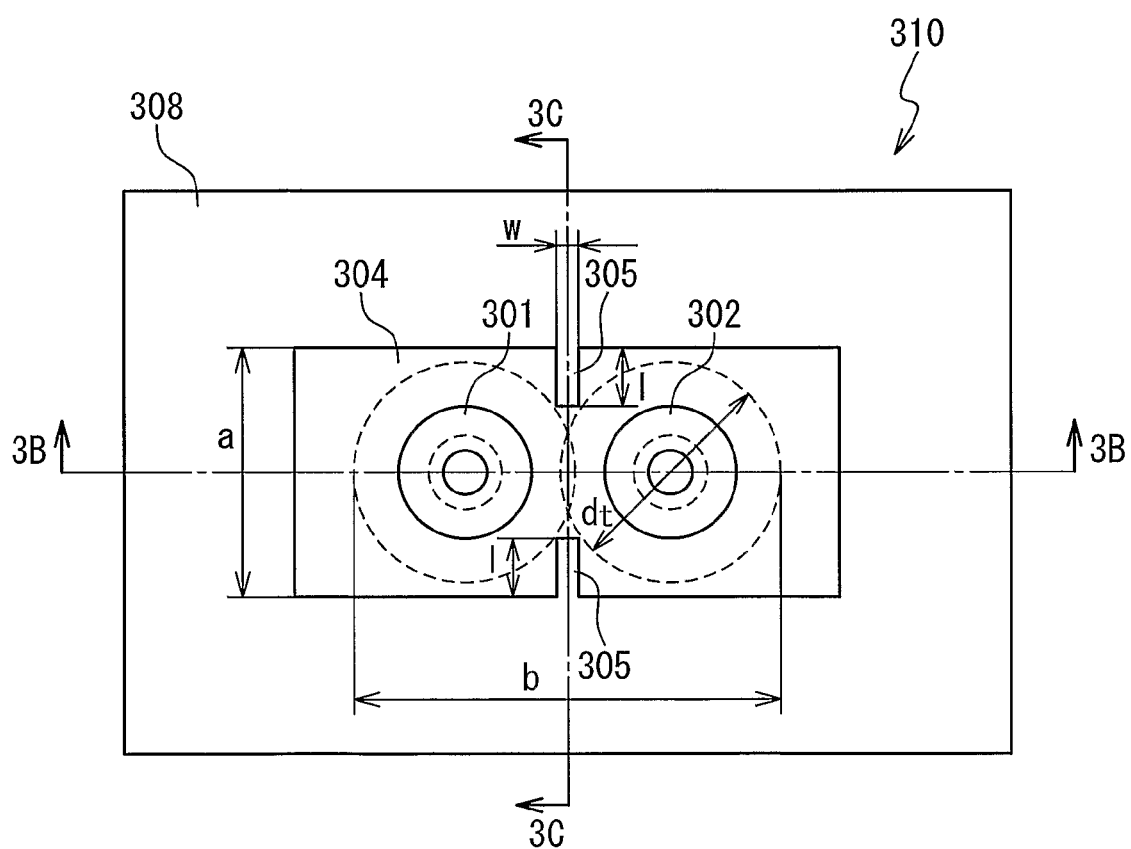
FIG. 3A is a top view of a multilayer substrate in another exemplary embodiment of the present invention.
Figure 3B:
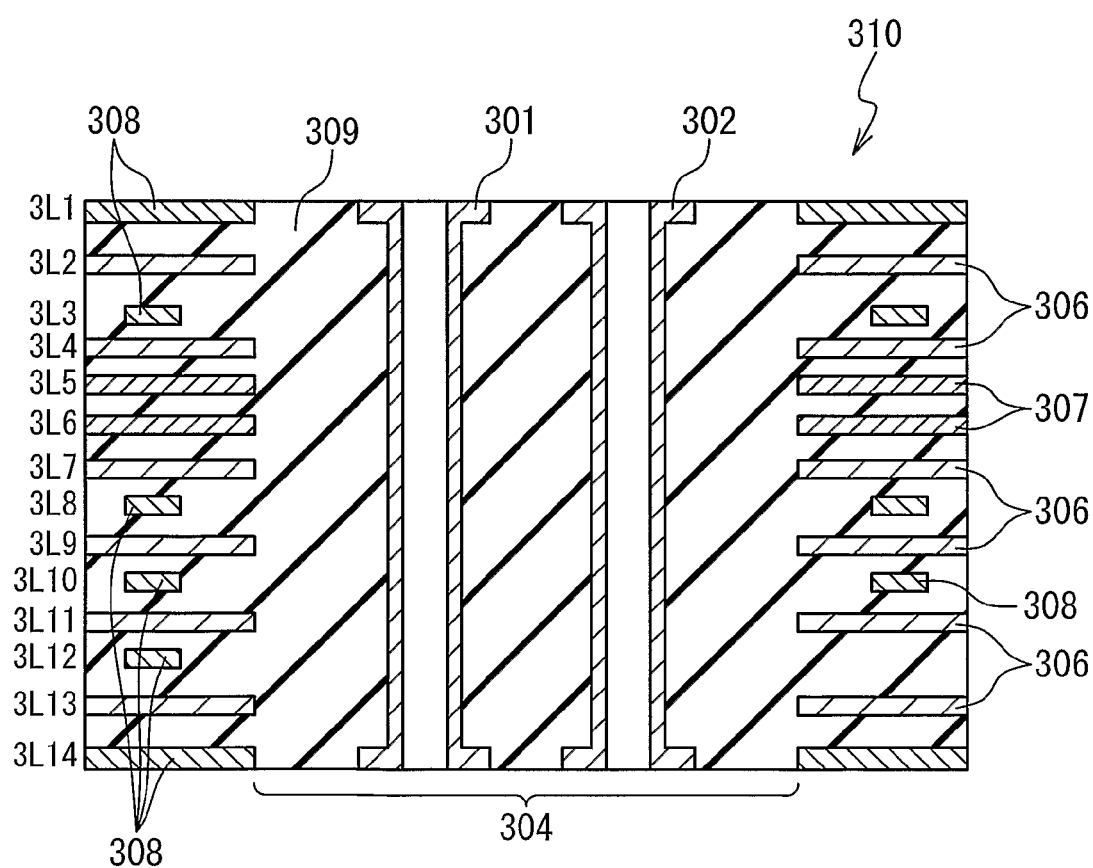
FIG. 3B is a vertical cross-sectional view illustrating the structure of the multilayer substrate shown in FIG. 3A on the 3B-3B section.
Figure 3C:
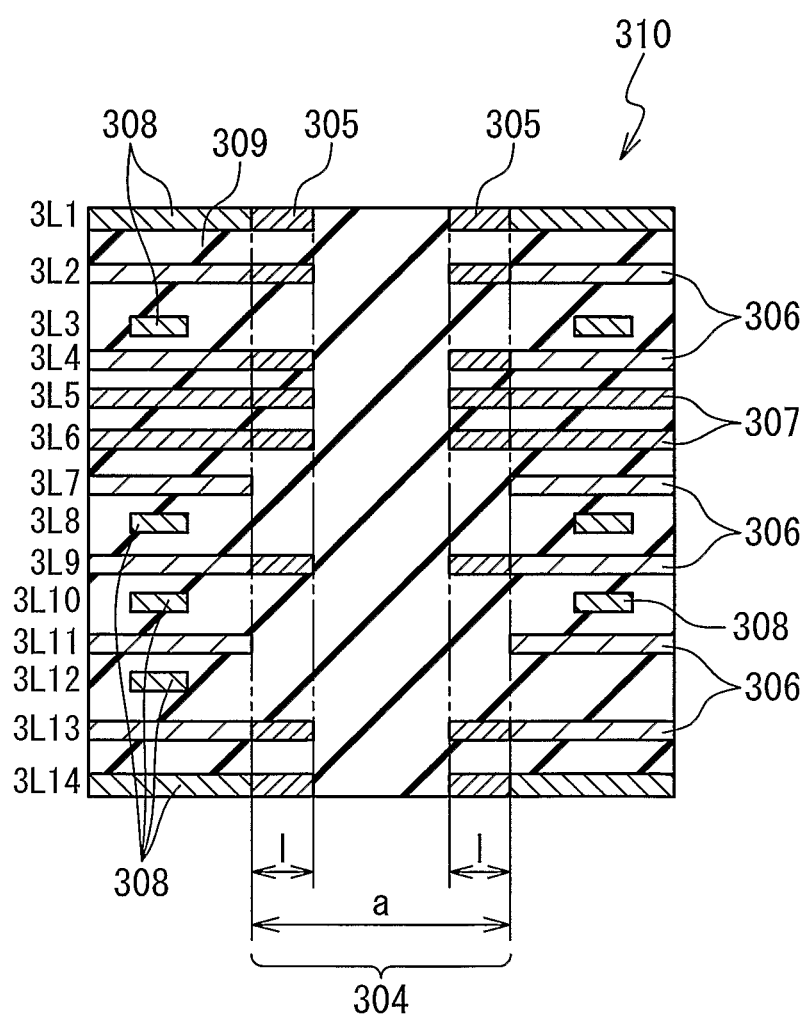
FIG. 3C is a vertical cross-sectional view illustrating the structure of the multilayer substrate shown in FIG. 3A on the 3C-3C section.

In FIG. 3A-3C, another exemplary embodiment of the multilayer substrate is shown. The multilayer substrate 310 is provided with fourteen conductive layers, denoted by the numerals 3L1-3L14, and two signal vias 301 and 302. The clearance region 304 provides the isolation of the signal vias 301 and 302 from conductor planes of the conductive layers 3L1 to 3L14. Conductive posts 305 are formed symmetrically between the signal vias 301 and 302 at conductor layers 3L1, 3L2, 3L4, 3L5, 3L6, 3L9, 3L13, and 3L14, reducing crosstalk effects between the signal vias 301 and 302. Conductor planes of the respective conductor layers include ground planes 306, power supply planes 307 and signal layers 308.

It should be noted that the conductive posts 305 are disposed at the conductor layers 3L1, 3L2, 3L4, 3L5, 3L6, 3L9, 3L13 and 3L14. The control of the characteristic impedance in the via structures may be achieved by adjusting the length, l, and width, w, of the conductive posts 305. The dimensional tolerance of the via fabrication process may be applied as an approach to define the length and width of the conductive posts. In this approach, dimensions of the conductive posts 305 are chosen as non-crossing the imaginary circle of diameter $d_t$ defining tolerances of via fabrication process. In FIGS. 1-3, the multilayer substrates comprise single-ended via structures.

Figure 4B:
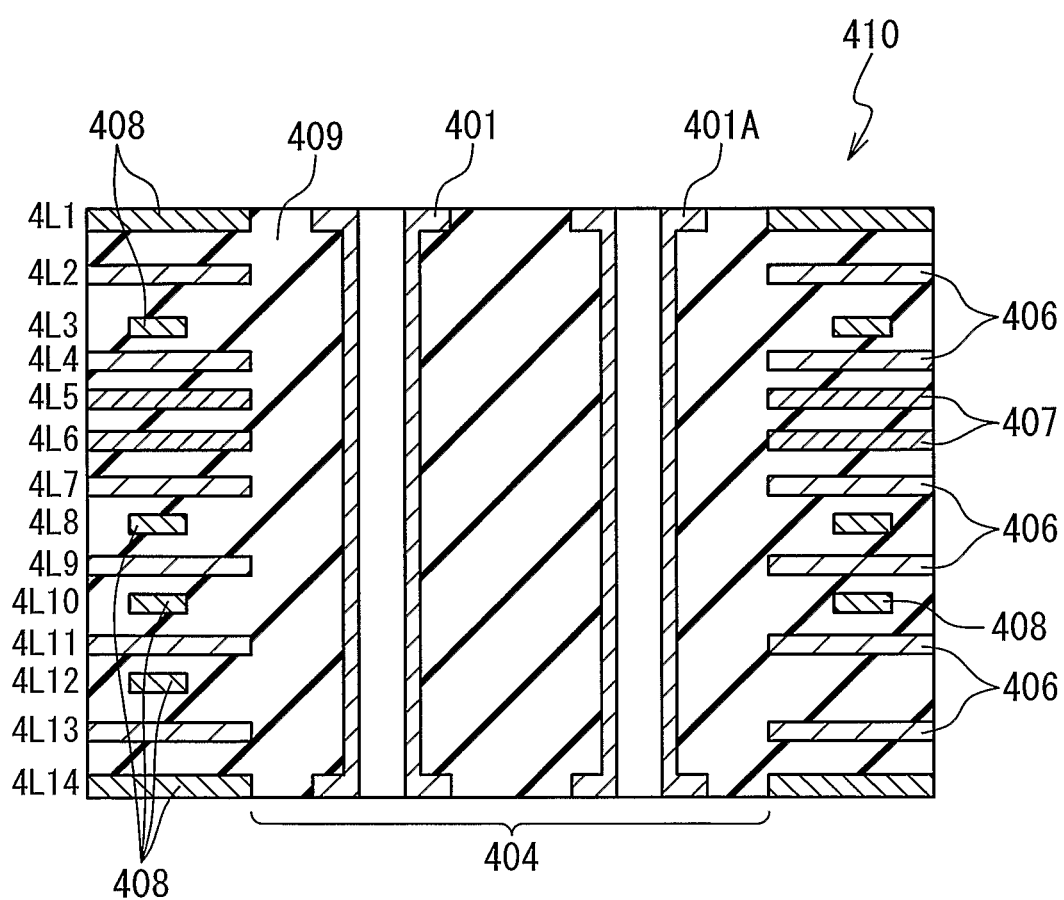
FIG. 4B is a vertical cross-sectional view illustrating the structure of the multilayer substrate shown in FIG. 4A on the 4B-4B section.

Also, differential signaling is an important technique applied in high-speed data transmission channels, for example. In FIGS. 4A-4B, a multilayer substrate for differential circuits is shown. The multilayer substrate 410 is provided with differential via pairs in which a first pair is formed by signal vias 401 and 401A, a second pair is obtained by signal vias 402 and 402A, and a third pair is arranged by signal vias 403 and 403A. The signal vias 401-403, and 401A-403A are disposed through a clearance region 404 which provides isolation of the differential via pairs from the ground planes 406, power supply planes 407, and signal layers 408. Dimensions of the clearance region 404 may be used to improve impedance matching for the via structures in a wide frequency band; for example, the side length, a, of the clearance region may be used as a parameter for controlling the characteristic impedance. The conductive posts 405 are applied here to reduce crosstalk effects and as an additional degree of freedom to control the characteristic impedance. The length and width of the conductive posts 405 may be defined by dimensional tolerances of the via fabrication process.

Also, the conductive posts 405 may be equally spaced from neighboring signal vias to provide the same coupling effect to these signal vias; this is important to reduce skew in differential via pairs.

Figure 4C:
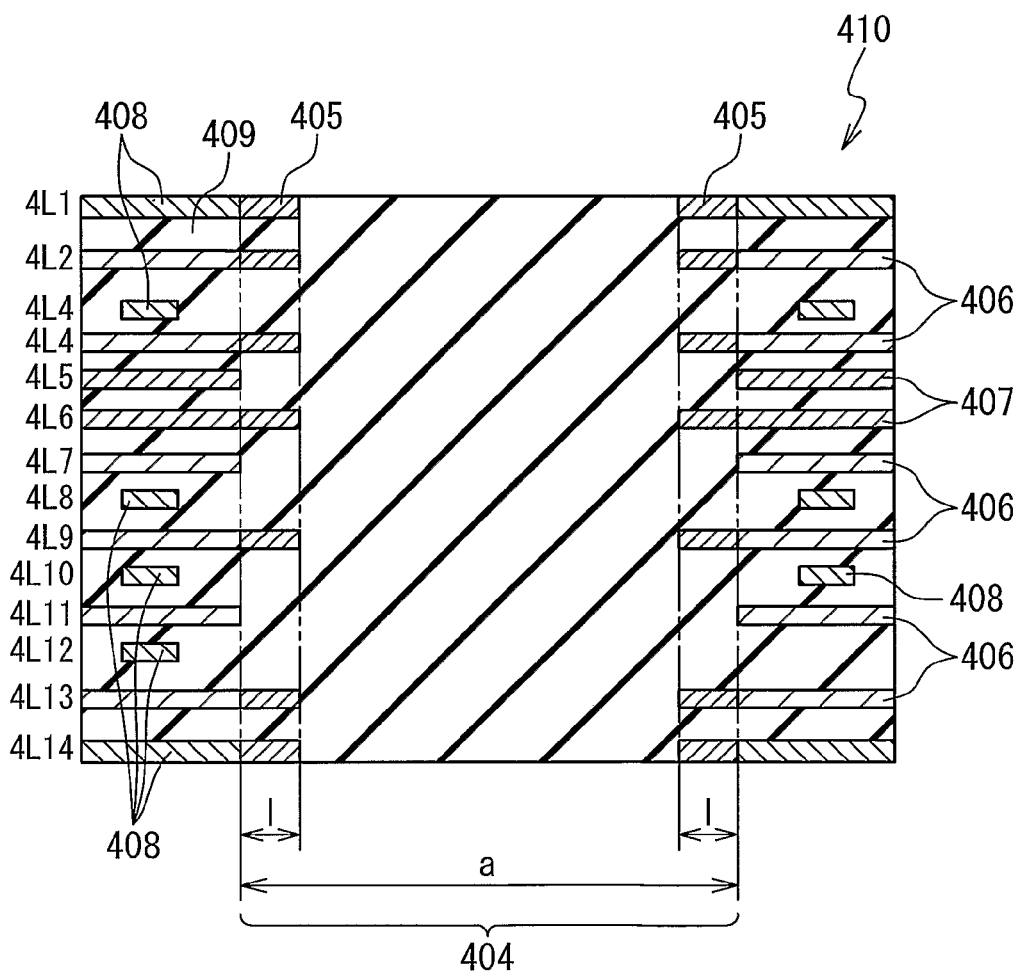
FIG. 4C is a vertical cross-sectional view illustrating the structure of the multilayer substrate shown in FIG. 4A on the 4C-4C section.

In FIGS. 4A-4C, the vias forming differential pairs are placed symmetrically with respect of a vertical plane A-A'.

Figure 5B:
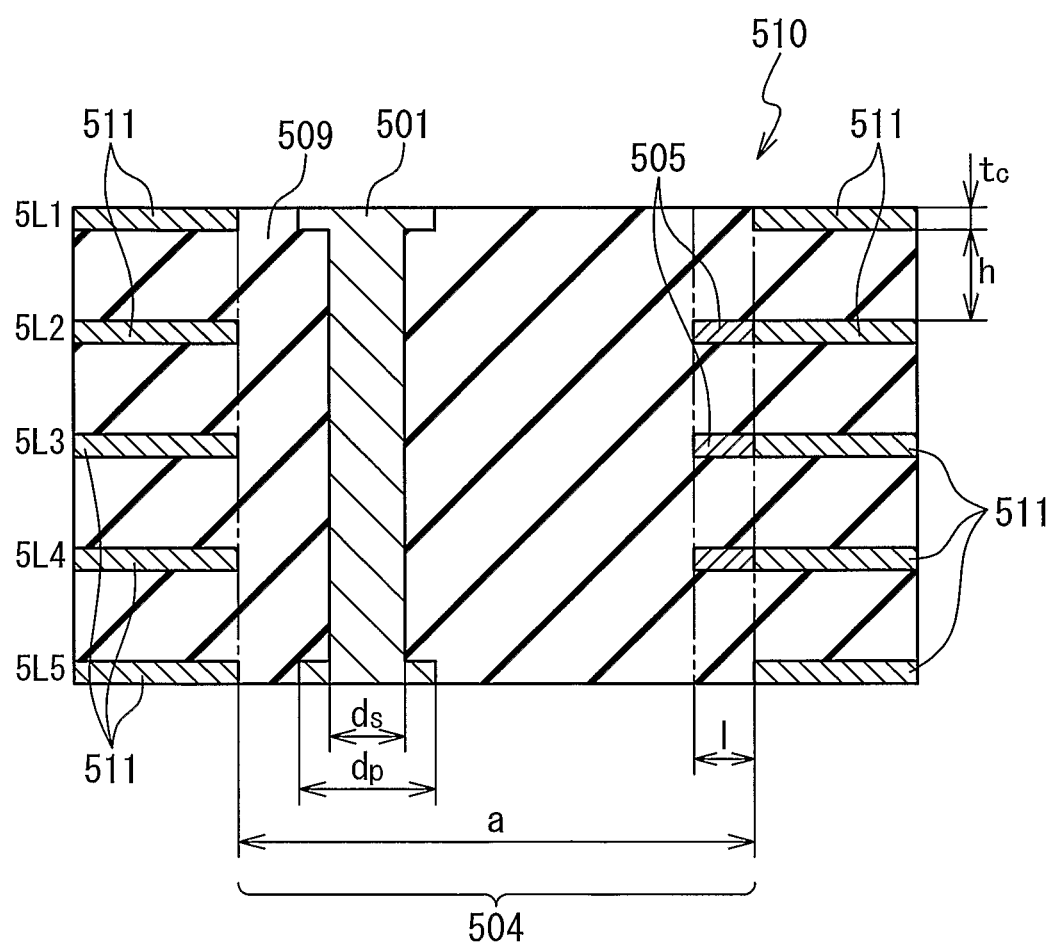
FIG. 5B is a vertical cross-sectional view illustrating the structure of the multilayer substrate shown in FIG. 5A on the 5B-5B section.

In FIGS. 5A-5B, another multilayer substrate comprising differential via pairs is presented. In this five-conductor-layer substrate, positions of the vias forming differential via pairs are non-symmetrical with respect to the vertical plane A-A'. For example, one differential pair is obtained by signal vias 501 and 501A, and another via pair is consisted of signal vias 502 and 502A. The differential via pairs are provided through a clearance region 504. The clearance region 504 provides isolation of the differential via pairs from conductor planes of the conductor layers 5L1-5L4. The conductive posts 505 having a length of l and a width of w are used to reduce crosstalk effects between differential via pairs.

The five-conductor-layer substrate presented in FIGS. 5A-5B is used to show the effect of conductive posts and mechanisms leading to reduction of the crosstalk by means of the application of such posts.

In simulations, the finite-difference time-domain method, which is well-known and one of the most accurate numerical methods, has been used. Dimensions of the substrate shown in FIGS. 5A-5B are as follows: $d_s$=0.1 mm; $d_p$=0.15 mm; h=0.2 mm; $t_c$=0.012 mm; $d_v$=0.25 mm; $d_h$=0.4 mm. An LTCC (Low Temperature Co-fired Ceramics) substrate is used as the multilayer substrate 510; the dielectric material 509 is based on the LTCC material with relative permittivity of 7.1. The dimensions of the conductive posts are as: l=0.23 mm; w=0.04 mm.

Figure 6:
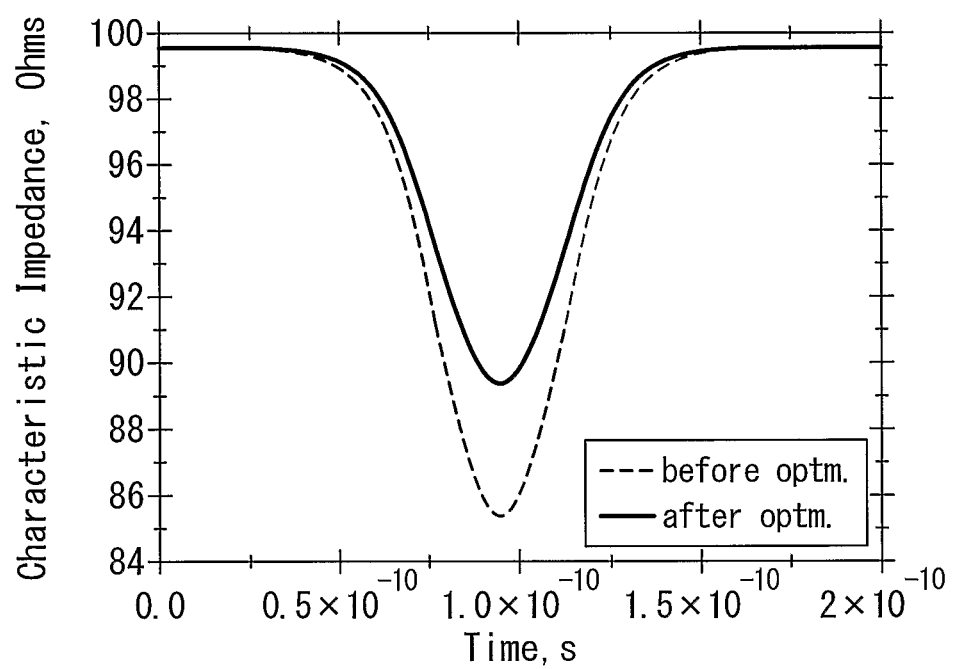
FIG. 6 is a graph showing characteristic impedances in the time domain before and after the optimization by means of clearance region dimensions (for the structure shown in FIG. 5A-5B)

To show an optimization procedure, the characteristic impedance in time domain is presented in FIG. 6. In this figure, before optimization a=0.8 mm and after optimization a=1.0 mm. As one can see, step-by-step changes of the dimensions of the clearance region can give considerable improvement of the characteristic impedance.

Figure 7:
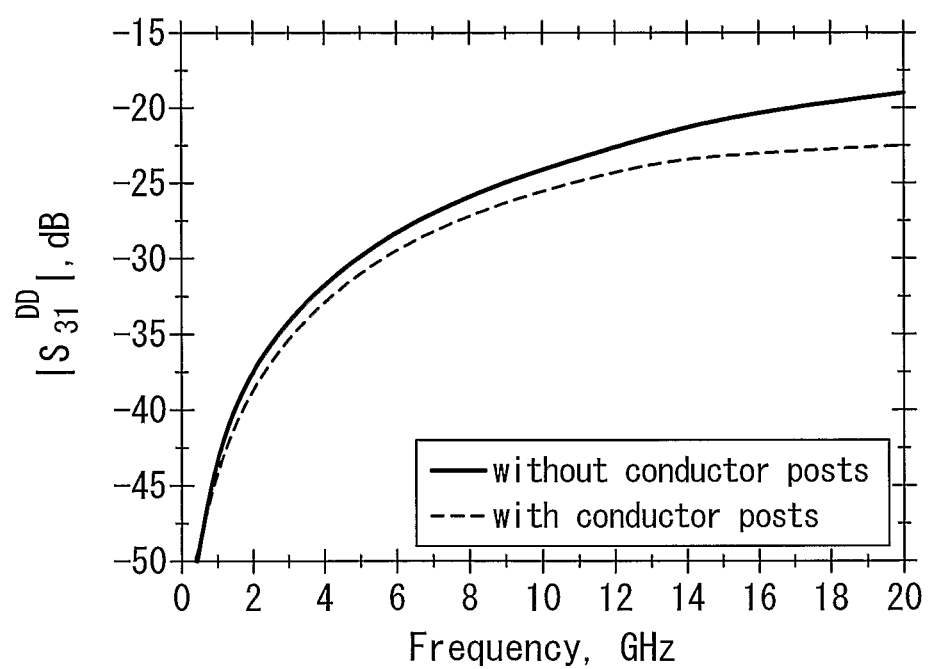
FIG. 7 is a graph showing the effect of conductor posts on crosstalk (structure shown in FIG. 5A-5B)

Also in FIG. 7, near-end coupling coefficients for the differential modes are presented by means of the magnitude of the $S_{31}$-parameter. As is understood from this figure, the use of the conductive posts 505 in the clearance region 504 effectively reduces crosstalk (near-end coupling coefficients), especially at higher frequencies.

Figure 8:
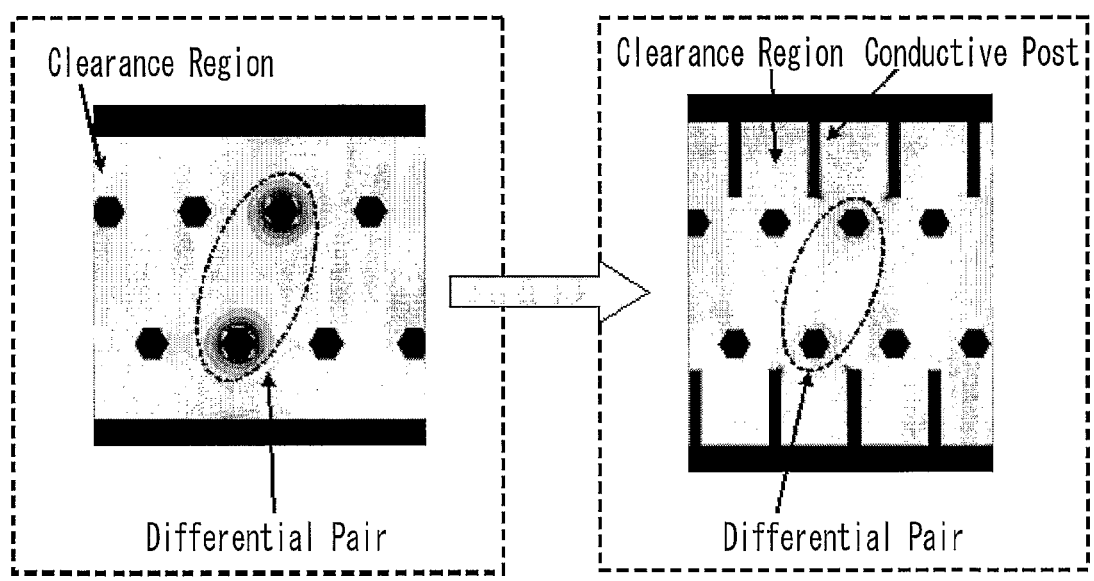
FIG. 8 shows the electric-field distribution at 10 GHz in the multilayer substrates with and without conductive posts.

In FIG. 8, the mechanism leading to reduction of the crosstalk is presented by means of the simulated peak of the electric field at 10 GHz taken in a cross-section of the multilayer substrate 510. As one can see, the use of the conductive posts 505 leads to a concentration of the electric field in the area between the conductive posts and the signal vias, while effectively decreasing the crosstalk.

While the present invention has been particularly shown and described with reference to exemplary embodiments thereof, the invention is not limited to these embodiments. It will be understood by those of ordinal skill in the art that various changes in form and details may be made therein without departing from the spirit and scope of the present invention as defined by the claims.

The invention claimed is:

1. A multilayer substrate comprising:
    a conductor plane region in which a plurality of conductor planes are disposed;
    a clearance region filled with dielectric material and disposed adjacent to said conductor plane region so that said plurality of conductor planes are excluded from said clearance region;
    a plurality of signal vias disposed through said clearance region so that said plurality of signal vias are isolated from said plurality of conductor planes by said dielectric material; and
    a conductor post connected to one of said plurality of conductor planes and disposed to extend toward a midpoint of an imaginary straight line connecting centers of two of said signal vias,
    wherein said midpoint is located in said dielectric material.

2. The multilayer substrate according to claim 1, wherein an in-plane shape of said clearance region is rectangular.

3. The multilayer substrate according to claim 2, wherein said two of said signal vias are placed symmetrically with respect to said conductor post.

4. The multilayer substrate according to claim 3, wherein a length of said conductor post is defined by a dimensional tolerance of via fabrication process providing no contact passage between said two of said signal vias and said conductor post.

5. The multilayer substrate according to claim 4, wherein said plurality of signal vias includes a differential via pair used for differential signaling.

6. The multilayer substrate according to claim 3, wherein said plurality of signal vias includes a differential via pair used for differential signaling.

7. The multilayer substrate according to claim 2, wherein a length of said conductor post is defined by a dimensional tolerance of via fabrication process providing no contact passage between said two of said signal vias and said conductor post.

8. The multilayer substrate according to claim 7, wherein said plurality of signal vias includes a differential via pair used for differential signaling.

9. The multilayer substrate according to claim 2, wherein said plurality of signal vias includes a differential via pair used for differential signaling.

10. The multilayer substrate according to claim 1, wherein said two of said signal vias are placed symmetrically with respect to said conductor post.

11. The multilayer substrate according to claim 10, wherein a length of said conductor post is defined by a dimensional tolerance of via fabrication process providing no contact passage between said two of said signal vias and said conductor post.

12. The multilayer substrate according to claim 11, wherein said plurality of signal vias includes a differential via pair used for differential signaling.

13. The multilayer substrate according to claim 10, wherein said plurality of signal vias includes a differential via pair used for differential signaling.

14. The multilayer substrate according to claim 1, wherein a length of said conductor post is defined by a dimensional tolerance of via fabrication process providing no contact passage between said two of said signal vias and said conductor post.

15. The multilayer substrate according to claim 14, wherein said plurality of signal vias includes a differential via pair used for differential signaling.

16. The multilayer substrate according to claim 1, wherein said plurality of signal vias includes a differential via pair used for differential signaling.

17. A multilayer substrate comprising:
    a conductor plane region in which a plurality of conductor planes isolated by dielectric material are disposed;

a clearance region filled with said dielectric material and disposed adjacent to said conductor plane region so that said plurality of conductor planes are excluded from said clearance region;

a plurality of signal via pairs each including a pair of signal vias used for differential signaling and disposed through said clearance region so that said plurality of signal via pairs are isolated from said plurality of conductor planes by said material;

a first conductor post connected to one of said plurality of conductor planes, disposed near a first signal via pair of said plurality of signal pairs and extended toward a first midpoint of an imaginary straight line connecting centers of a pair of signal vias of said first signal via pair; and a second conductor post connected to said one of said plurality of conductor planes, disposed near a second signal via pair of said plurality of signal pairs and extended toward a second midpoint of an imaginary straight line connecting centers of a pair of signal vias of said second signal via pair, wherein said first midpoint and said second midpoint are located in said dielectric material.

18. The multilayer substrate according to claim 17, wherein an in-plane shape of said clearance region is rectangular.

19. The multilayer substrate according to claim 18, wherein a length of said first conductor post is defined by a dimensional tolerance of via fabrication process providing no contact passage between said first signal via pair and said first conductor post, and a length of said second conductor post is defined by said dimensional tolerance providing no contact passage between said second signal via pair and said second conductor post.

20. The multilayer substrate according to claim 17, wherein said signal vias of said first signal via pair are placed symmetrically with respect to said first conductor post and said signal vias of said second signal via pair are placed symmetrically with respect to said second conductor post.

21. The multilayer substrate according to claim 20, wherein a length of said first conductor post is defined by a dimensional tolerance of via fabrication process providing no contact passage between said first signal via pair and said first conductor post, and a length of said second conductor post is defined by said dimensional tolerance providing no contact passage between said second signal via pair and said second conductor post.

22. The multilayer substrate according to claim 17, wherein a length of said first conductor post is defined by a dimensional tolerance of via fabrication process providing no contact passage between said first signal via pair and said first conductor post, and a length of said second conductor post is defined by said dimensional tolerance providing no contact passage between said second signal via pair and said second conductor post.

23. The multilayer substrate according to claim 18, wherein said signal vias of said first signal via pair are placed symmetrically with respect to said first conductor post and said signal vias of said second signal via pair are placed symmetrically with respect to said second conductor post.

* * * * *